(12) United States Patent
Chen

(10) Patent No.: US 9,697,386 B2
(45) Date of Patent: Jul. 4, 2017

(54) ELECTRICAL CONNECTOR

(71) Applicant: LOTES CO., LTD, Keelung (TW)

(72) Inventor: Yu Sheng Chen, Keelung (TW)

(73) Assignee: LOTES CO., LTD., Keelung (TW)

( * ) Notice: Subject to any disclaimer, the term of this patent is extended or adjusted under 35 U.S.C. 154(b) by 0 days.

(21) Appl. No.: 15/069,140

(22) Filed: Mar. 14, 2016

(65) Prior Publication Data

US 2017/0033476 A1    Feb. 2, 2017

(30) Foreign Application Priority Data

Jul. 28, 2015  (CN) ..................... 2015 2 0552705 U
Oct. 30, 2015  (CN) ..................... 2015 2 0849195 U

(51) Int. Cl.
*H01R 13/625* (2006.01)
*G06K 7/00* (2006.01)

(52) U.S. Cl.
CPC ..................................... *G06K 7/00* (2013.01)

(58) Field of Classification Search
CPC ..................... H01R 12/7005; H01R 13/62994
USPC .................................................. 439/948, 345
See application file for complete search history.

(56) References Cited

U.S. PATENT DOCUMENTS

| | | | |
|---|---|---|---|
| 6,908,316 B2 * | 6/2005 | Ma ....................... | H05K 7/1053 439/331 |
| 7,101,210 B2 * | 9/2006 | Lin .......................... | H05K 7/12 439/331 |
| 7,497,716 B2 * | 3/2009 | Hsu ....................... | H05K 7/1061 439/331 |
| 7,575,449 B1 * | 8/2009 | Cai ....................... | H05K 7/1053 439/135 |
| 8,233,284 B2 * | 7/2012 | Ju ............................. | H05K 7/00 174/32 |
| 8,647,138 B1 * | 2/2014 | Chen .................... | H05K 7/1007 439/331 |
| 8,734,177 B2 * | 5/2014 | Tsai ....................... | H01R 12/52 439/331 |
| 8,998,625 B2 * | 4/2015 | Yeh ........................ | H01R 13/62 439/136 |
| 9,225,091 B2 * | 12/2015 | Ju .......................... | H01R 12/79 |
| 2006/0128201 A1 * | 6/2006 | Ju ......................... | H05K 7/1061 439/331 |
| 2009/0075512 A1 * | 3/2009 | Liao ..................... | H05K 7/1061 439/345 |
| 2012/0108096 A1 * | 5/2012 | Yeh ...................... | H05K 7/1053 439/345 |

(Continued)

*Primary Examiner* — Abdullah Riyami
*Assistant Examiner* — Nader Alhawamdeh
(74) *Attorney, Agent, or Firm* — Locke Lord LLP; Tim Tingkang Xia, Esq.

(57) ABSTRACT

An electrical connector for electrically connecting to a chip module. The chip module includes a base plate and a protruding portion projecting upward from the base plate. The electrical connector includes a socket for bearing the chip module, a fixing plate located above the base plate, and a load plate covering the chip module and the fixing plate. The load plate is provided with a first urging portion directly pressing the protruding portion downward, and a second urging portion pressing against the fixing plate downward, so that the fixing plate presses the base plate downward, thereby pressing the chip module downward and electrically connecting the chip module to the socket.

19 Claims, 13 Drawing Sheets

(56) References Cited

U.S. PATENT DOCUMENTS

2012/0252239 A1* 10/2012 Ju .................... H01R 12/85
439/157
2012/0302082 A1* 11/2012 Gattuso .............. H05K 7/12
439/345

* cited by examiner

ELECTRICAL CONNECTOR

CROSS-REFERENCE TO RELATED APPLICATION

This non-provisional application claims priority under 35 U.S.C. §119(a) on Patent Application Nos. 201520552705.4 filed in P.R. China on Jul. 28, 2015 and 201520849195.7 filed in P.R. China on Oct. 30, 2015, the entire contents of which are hereby incorporated by reference.

Some references, if any, which may include patents, patent applications and various publications, may be cited and discussed in the description of this invention. The citation and/or discussion of such references, if any, is provided merely to clarify the description of the present invention and is not an admission that any such reference is "prior art" to the invention described herein. All references listed, cited and/or discussed in this specification are incorporated herein by reference in their entireties and to the same extent as if each reference was individually incorporated by reference.

FIELD OF THE INVENTION

The present invention relates to an electrical connector, and more particularly to an electrical connector electrically connected to a chip module.

BACKGROUND OF THE INVENTION

With the development of ultra thinness of electronic products, a chip module is manufactured increasingly thinly, and therefore a base plate of the chip module is also increasingly thin.

Chinese Patent Application No. 200510074552.8 disclose an electrical connector. The electrical connector includes an insulting body, several conducting terminals received in the insulting body, a fixing plate installed at the periphery of the insulting body, a load plate pivotally connected to one end of the fixing plate, and a lever for pushing the load plate to move relative to the fixing plate. A chip module is fixed to the insulting body by using the lever and the load plate. The chip module includes a base plate and a protruding portion projecting upward from the center of the base plate. The load plate has a pressing portion. When the load plate presses downward, the pressing portion directly butts against the protruding portion, so that the chip module urges the terminals.

However, since the load plate applies a pressure to the protruding portion of the chip module, and the periphery of the base plate is not pressed from above, when the chip module is pressed, the periphery of the base plate is subject to an upward action force of the terminals, so that the periphery of the base plate is bent upward and deformed, so as to cause undesired contact between the terminals and the base plate.

Therefore, a heretofore unaddressed need exists in the art to address the aforementioned deficiencies and inadequacies.

SUMMARY OF THE INVENTION

In one aspect, the present invention relates to an electrical connector that prevents a base plate of a chip module from being deformed.

In one embodiment, an electrical connector is used for electrically connecting a chip module. The chip module includes a base plate and a protruding portion protruding upward from the base plate. The electrical connector includes a socket for bearing the chip module, a fixing plate located above the base plate, and a load plate covering the chip module and the fixing plate. The load plate includes a first urging portion directly pressing the protruding portion downward, and a second urging portion pressing against the fixing plate downward, so that the fixing plate presses the base plate downward, thereby pressing the chip module downward and electrically connecting the chip module to the socket.

In one embodiment, the fixing plate includes a base portion located above the base plate and a protruding block located above the base portion. The area of the base portion is greater than that of the protruding block. The second urging portion presses the protruding block downward, so that the protruding block presses the base portion downward and then the base portion presses the base plate downward.

In one embodiment, the fixing plate corresponding to at least one corner of the base plate is provided with the protruding block.

In one embodiment, the socket includes an insulting body and a plurality of terminals received in the insulting body. Four corners of the insulting body are provided with stop walls projecting upward and used for stopping the chip module. The fixing plate is provided with through-holes for exposing the stop walls. A positioning portion extends downward from the base portion. The positioning portion is located at an outer side of the insulting body. The through-hole is defined by the base portion and the positioning portion together.

In one embodiment, the protruding block extends from a side edge of the through-hole.

In one embodiment, the positioning portion is provided with a through-slot provided for an operator to grasp the fixing plate.

In one embodiment, a flat plate portion extends outward horizontally from the positioning portion, and the through-slot extends to the flat plate portion.

In one embodiment, a convex block, pressing the base plate downward and corresponding to the protruding block, protrudes downward from a bottom surface of the base portion.

In one embodiment, the fixing plate is provided with a clamping portion buckling a bottom surface of the chip module.

In one embodiment, the protruding portion comprises a sustaining portion provided for the first urging portion to press downward, the first urging portion is lower than the second urging portion, and the height of the protruding block is greater than or equal to the height of the sustaining portion.

In one embodiment, the base portion is provided with an opening provided for the protruding portion to pass through, and the protruding block comprises a first protruding block located in front of the center of the protruding portion and a second protruding block located behind the center of the protruding portion, wherein the first protruding block is located behind a front edge of the opening.

In one embodiment, in a direction from front to rear, a distance between the first protruding block and the center of the protruding portion is less than a distance between the second protruding block and the center of the protruding portion.

In one embodiment, the height of the first protruding block is unequal to that of the second protruding block.

In one embodiment, the height of the first protruding block is greater than the height of the second protruding block.

In one embodiment, the shape of the first protruding block is different from that of the second protruding block.

In one embodiment, a distance between the first protruding block and the front edge of the opening is 5 mm to 8 mm in a direction from front to rear.

In one embodiment, the protruding portion comprises a sustaining portion provided for the first urging portion to press downward, the opening comprises an open slot for reserving the sustaining portion, and the first protruding block is abut to the open slot.

In one embodiment, a top surface of the base portion is provided with a reserved slot for reserving the load plate.

In one embodiment, the first protruding block is located behind the reserved slot.

In one embodiment, the second protruding block is at least partially located behind a rear edge of the opening.

Compared with the related art, a load plate of the electrical connector according to certain embodiments of the present invention is provided with a first urging portion and a second urging portion. The first urging portion directly presses a protruding portion of a chip module downward. The second urging portion presses against a fixing plate downward, and the fixing plate presses a base plate downward. Thus a risk that the base plate is bent upward and deformed is prevented.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the invention and together with the written description, serve to explain the principles of the invention. Wherever possible, the same reference numbers are used throughout the drawings to refer to the same or like elements of an embodiment.

DETAILED DESCRIPTION OF THE INVENTION

Figure 1:
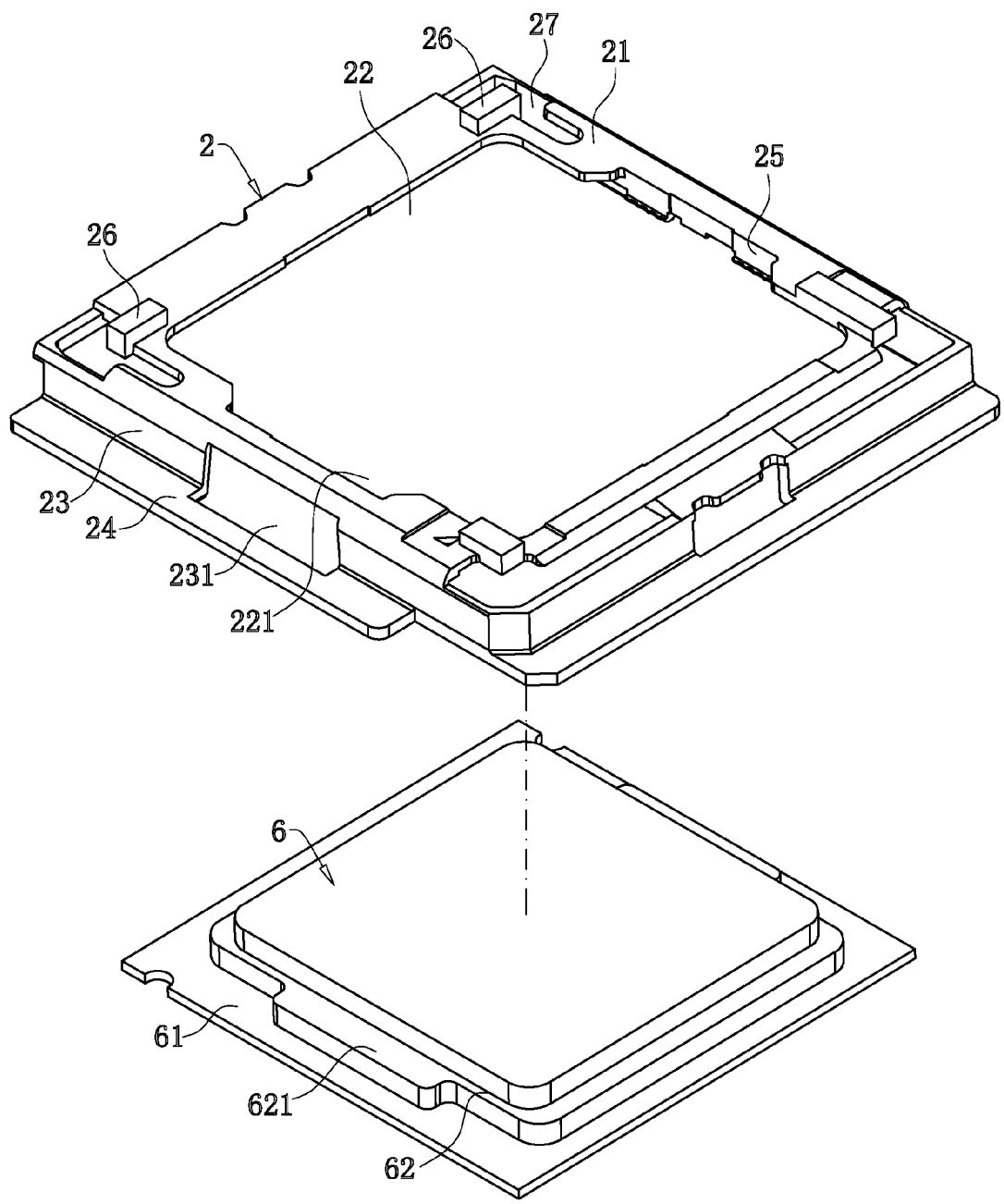
FIG. 1 is a schematic diagram of a fixing plate and a chip module before assembly of an electrical connector according to a first embodiment of the present invention.

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-13. In accordance with the purposes of this invention, as embodied and broadly described herein, this invention, in one aspect, relates to an electrical connector.

As shown in FIGS. 1-6, an electrical connector according to a first embodiment of the present invention is used for electrically connecting with a chip module 6. The electrical connector includes a socket 1, a fixing member 4 located behind the socket 1, a lever 5 pivotally connected to the fixing member 4, a load plate 3 pivotally connected to the lever 5 and covering the socket 1, and a fixing plate 2 located between the chip module 6 and the load plate 3.

Figure 2:
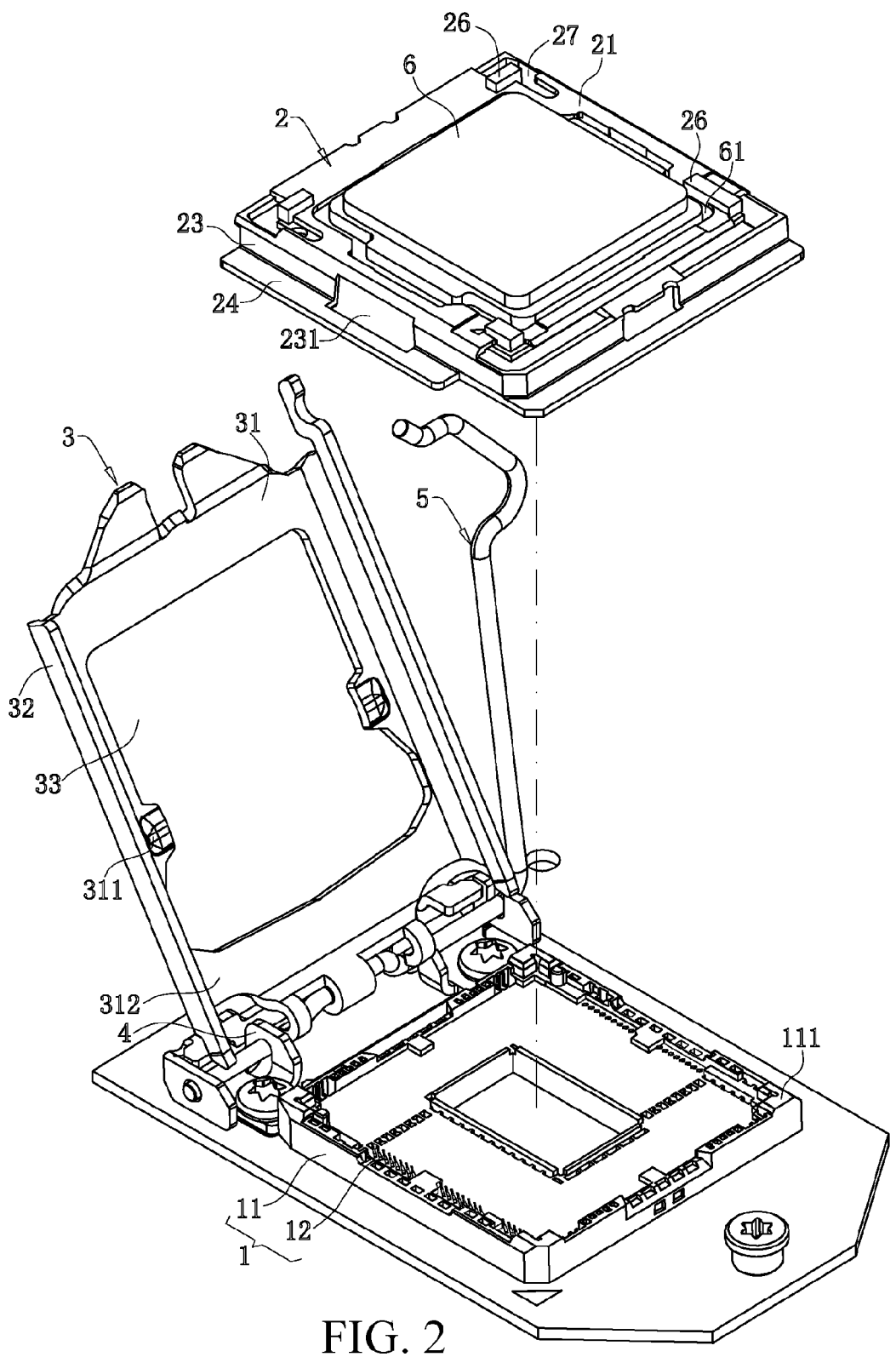
FIG. 2 is a schematic diagram of the fixing plate carrying the chip module before being assembled to an insulting body in the first embodiment.
Figure 3:
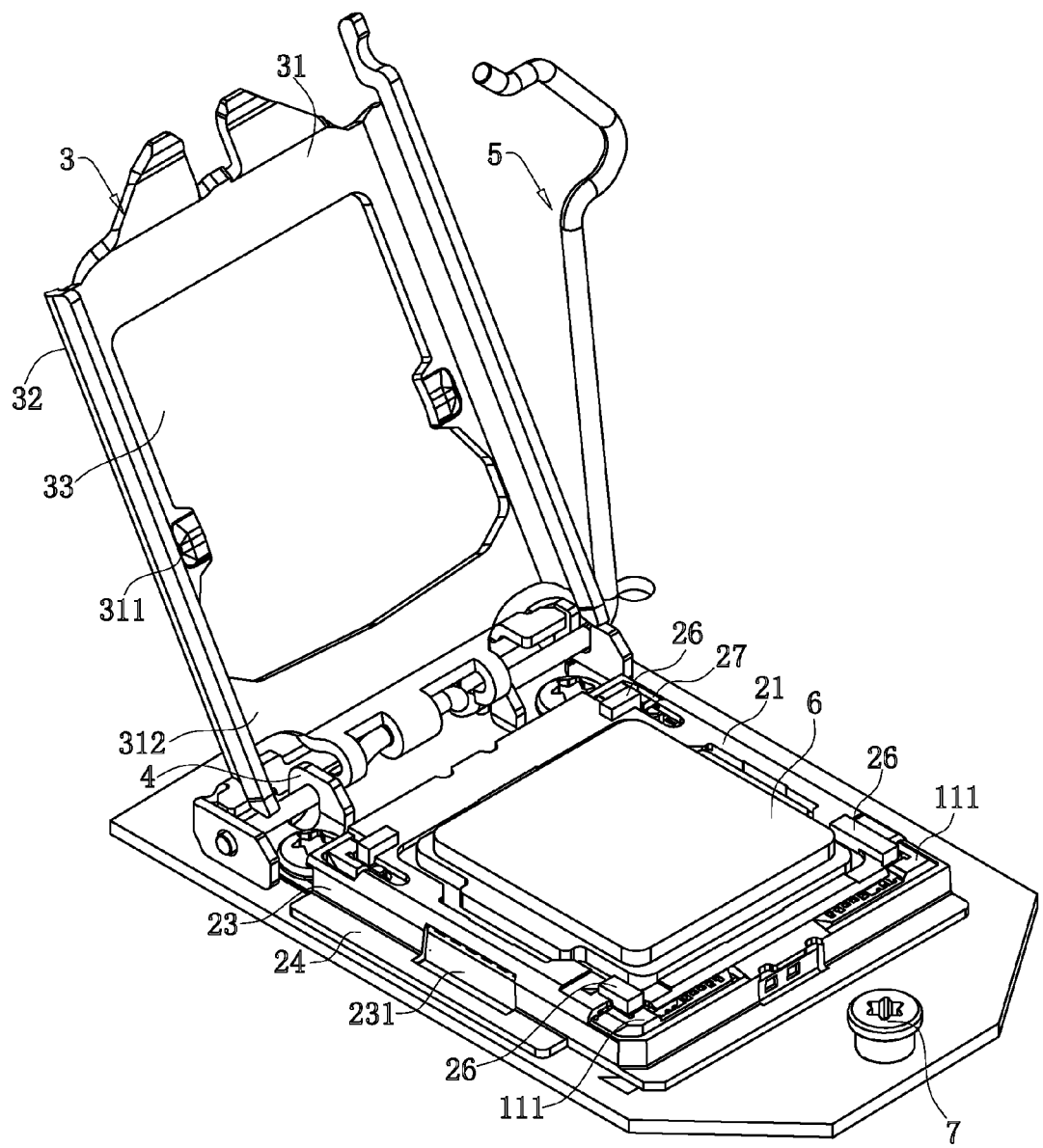
FIG. 3 is a schematic diagram of the fixing plate carrying the chip module after being assembled to the insulting body in the first embodiment.
Figure 4:
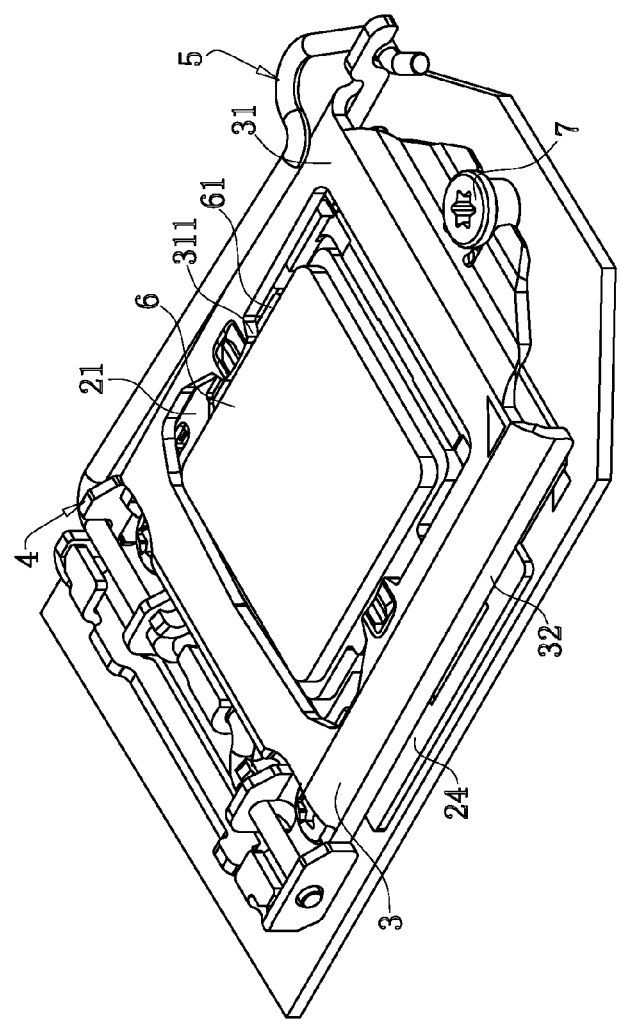
FIG. 4 is a schematic diagram of a load plate and a lever after being rotated and closed in the first embodiment.

As shown in FIGS. 2 and 3, the socket 1 includes an insulting body 11 and multiple terminals 12 received in the insulting body 11, and four corners of the insulting body 11 are provided with stop walls 111 protruding upward and used for stopping the chip module 6.

As shown in FIG. 1, the chip module 6 includes a base plate 61, and a protruding portion 62 protruding upward from the center of the base plate 61. The protruding portion 62 includes two opposite sustaining portions 621 located above the base plate 61, and the protruding portion 62 defines a center 620.

Figure 5:
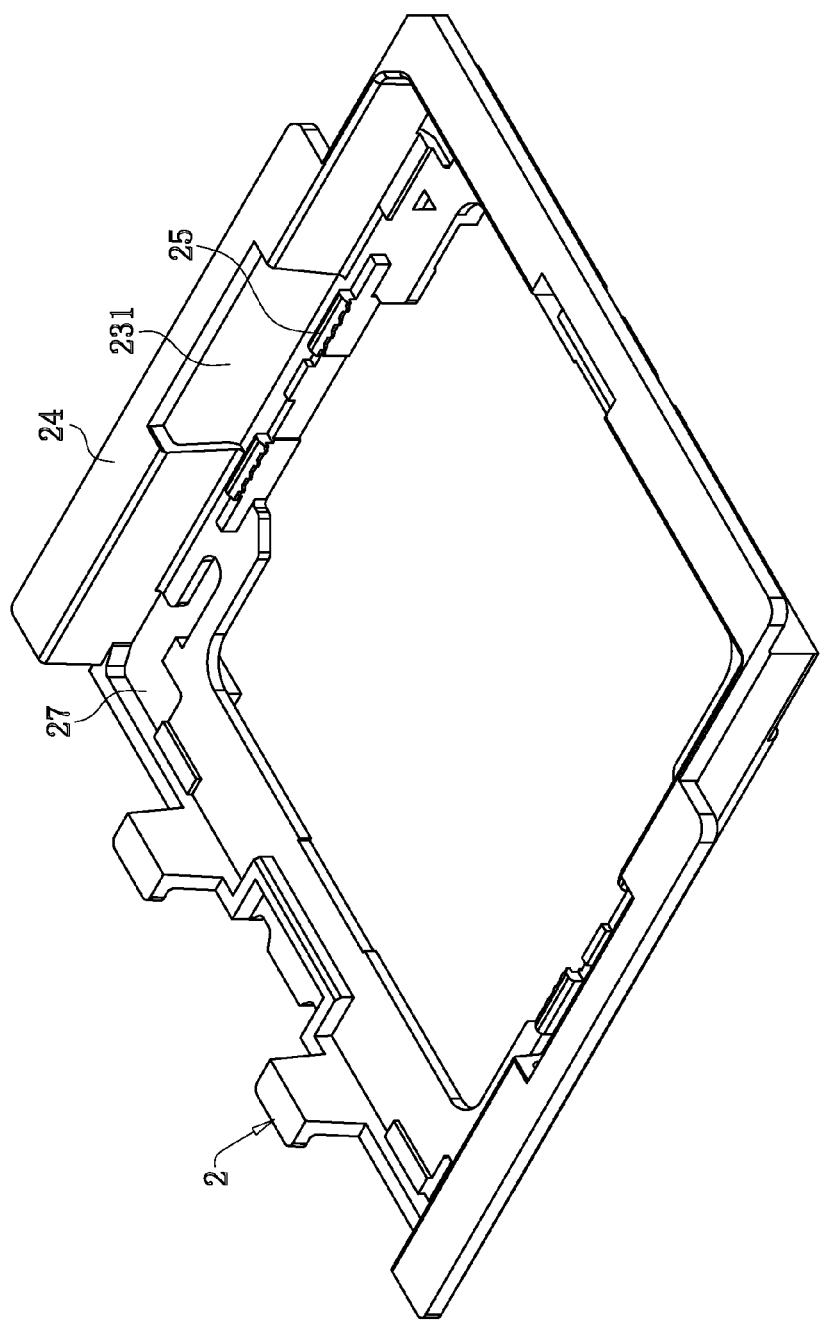
FIG. 5 is a schematic diagram of the fixing plate in another direction in the first embodiment.
Figure 6:
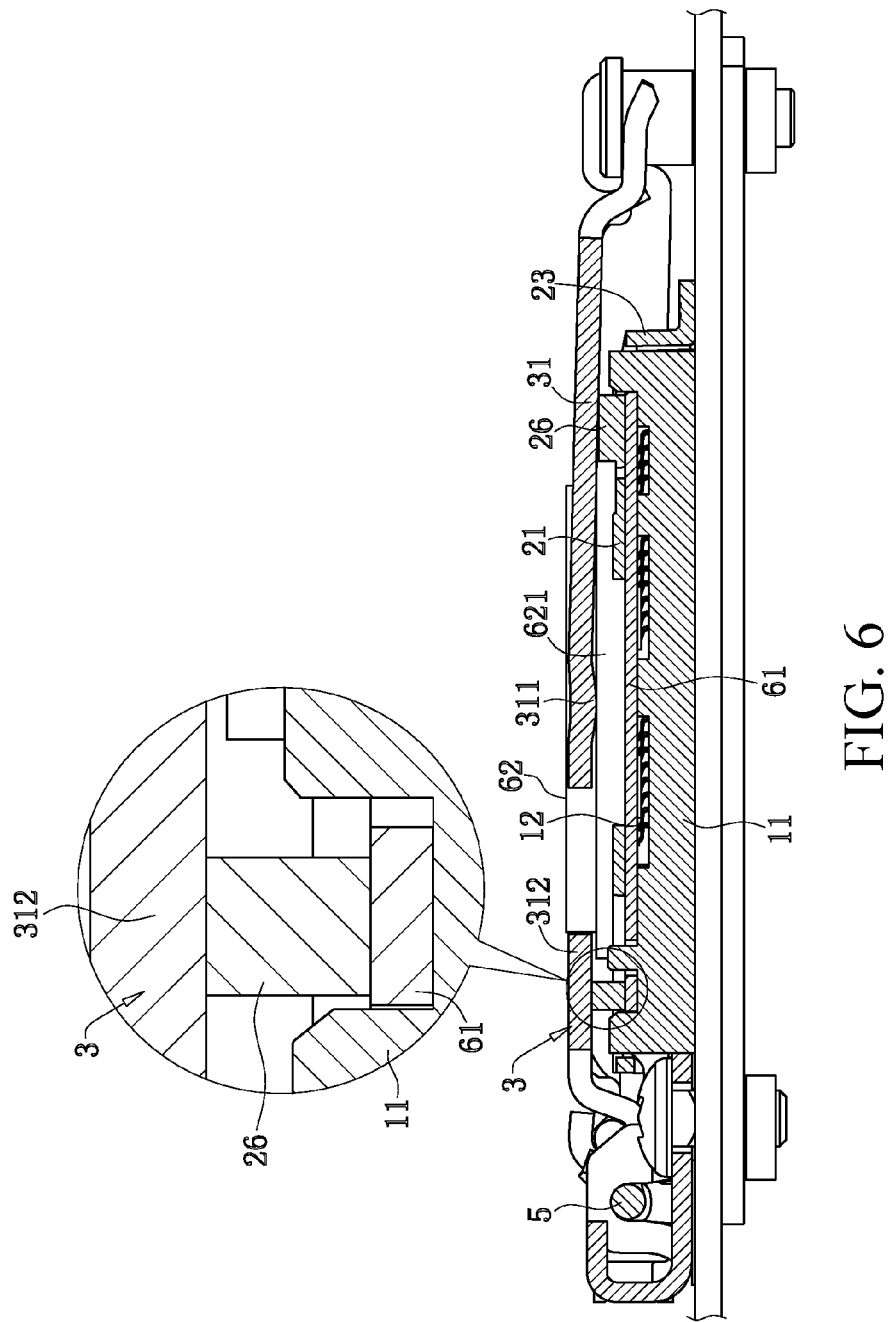
FIG. 6 is a sectional view of the load plate and the lever after being rotated and closed in the first embodiment.

As shown in FIGS. 1, 2 and 5, the fixing plate 2 includes a base portion 21 located above the base plate 61. The base portion 21 is provided with an opening 22 for the protruding portion 62 to pass through. The opening 22 includes two open slots 221 respectively reserving space for the two sustaining portions 621. A front end of a top surface of the base portion 21 is provided with a reserved slot 29 reserving space for the load plate 3. Multiple protruding blocks 26 project upward from the base portion 21 (in other embodiments, the protruding blocks 26 may also be separated from the base portion 21 and formed independently), and the protruding blocks 26 correspond to four corners of the base plate 61 (in other embodiments, the protruding blocks 26 may be only disposed above one corner or two diagonal corners of the base plate 61, or may be disposed above other positions of the base plate 61, or the protruding blocks 26 are not provided). The area of the base portion 21 is greater than that of the protruding block 26, and the height of the protruding block 26 is greater than the height of the sustaining portion 621 (in other embodiments, the height of the protruding block 26 may also be equal to the height of the sustaining portion 621). A positioning portion 23 extends downward from the periphery of the base portion 21, is located at an outer side of the insulting body 11, and is used for positioning the fixing plate 2 to the insulting body 11. The positioning portion 23 is provided with a groove 231 providing convenience for an operator to grasp the fixing plate 2. A flat plate portion 24 horizontally extends outward from a bottom end of the positioning portion 23. When deviation occurs during assembly alignment, the flat plate portion 24 urges the top surface of the insulting body 11, which may ensure that the positioning portion 23 does not easily contact the terminals 12, so as to protect the terminals 12. A clamping portion 25 extends downward from each of the left and right sides of the opening 22 and buckles the bottom surface of the chip module 6, so as to fix the chip module 6 to the fixing plate 2, so that the fixing plate 2 may carry the chip module 6 to the insulting body 11. The fixing plate 2 is provided with a through-hole 27 for exposing the stop wall 111, and the protruding block 26 extends from a side edge of the through-hole 27. The protruding block 26 may be made of rubber or an elastic plastic material.

In other embodiments, the fixing plate 2 may be a rubber block or other elastic plastic blocks. This rubber block may be attached to the base plate 61 or the load plate 3. There may be one or more rubber blocks. Additionally, the fixing plate 2 may be square or bar-shaped or frame-shaped or ring-shaped or the like.

As shown in FIGS. 2 and 3, the load plate 3 includes a main body 31 located above the insulting body 11, and two opposite side plates 32 extending downward from left and right sides of the main body 31. The two side plates 32 are respectively located at left and right sides of the insulting body 11. The center of the main body 31 is provided with a perforation 33 for the protruding portion 62 to pass through. The main body 31 is provided with two first urging portions 311 projecting downward and directly pressing the two sustaining portions 621 downward. The first urging portions 311 are respectively located at left and right sides of the perforation 33. The lower surface of the main body 31 is provided with a second urging portion 312 corresponding to the protruding block 26. The first urging portion 311 is lower than the second urging portion 312. The second urging portion 312 presses the protruding block 26 downward, so that the protruding block 26 presses the base portion 21 downward and then the base portion 21 presses the base plate 61 downward.

As shown in FIGS. 1-6, during usage of the electrical connector according to certain embodiments of the present invention, at first, the chip module 6 is fixed to the fixing plate 2. The fixing plate 2 carries the chip module 6 and is assembled to the insulting body 11. Then the load plate 3 covers downward, the lever 5 is rotated downward, and the load plate 3 moves forward. Finally, the front end of the load plate 3 is locked to a screw 7 located in front of the socket 1, and the lever 5 snap-fits the load plate 3, so that the lever 5 presses the back end of the load plate 3, and then the load plate 3 presses the chip module 6 so that the chip module 6 is roughly in a horizontal state finally. During this process, the first urging portion 311 directly presses the sustaining portion 621 downward, and the second urging portion 312 presses against the protruding block 26 downward, so that the base portion 21 presses the base plate 61 downward. Therefore, when the chip module 6 is pressed, the base plate 61 is not warped, and the chip module 6 urges the terminals 12.

Figure 7:
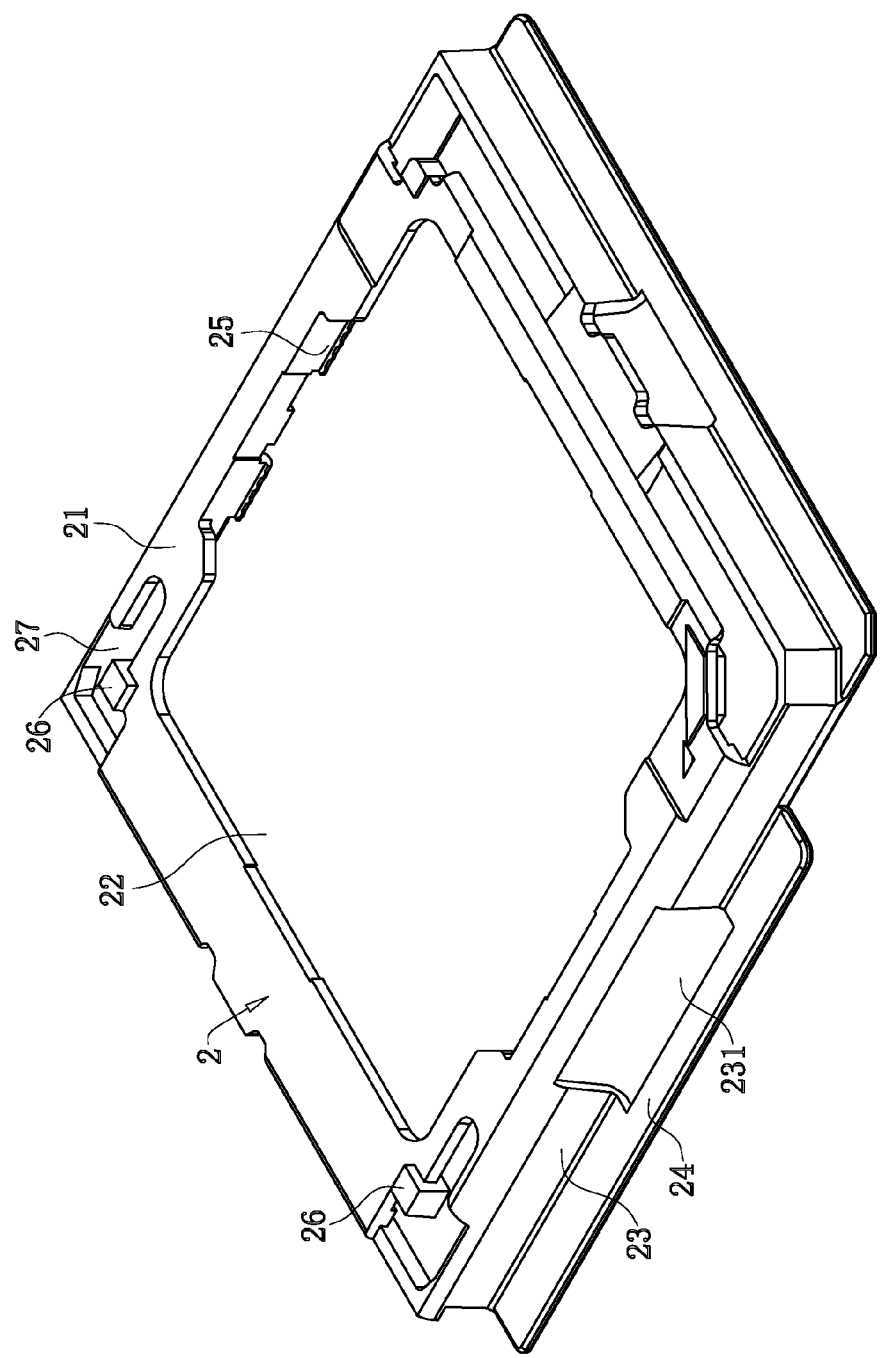
FIG. 7 is a schematic diagram of a fixing plate of an electrical connector according to a second embodiment of the present invention.
Figure 8:
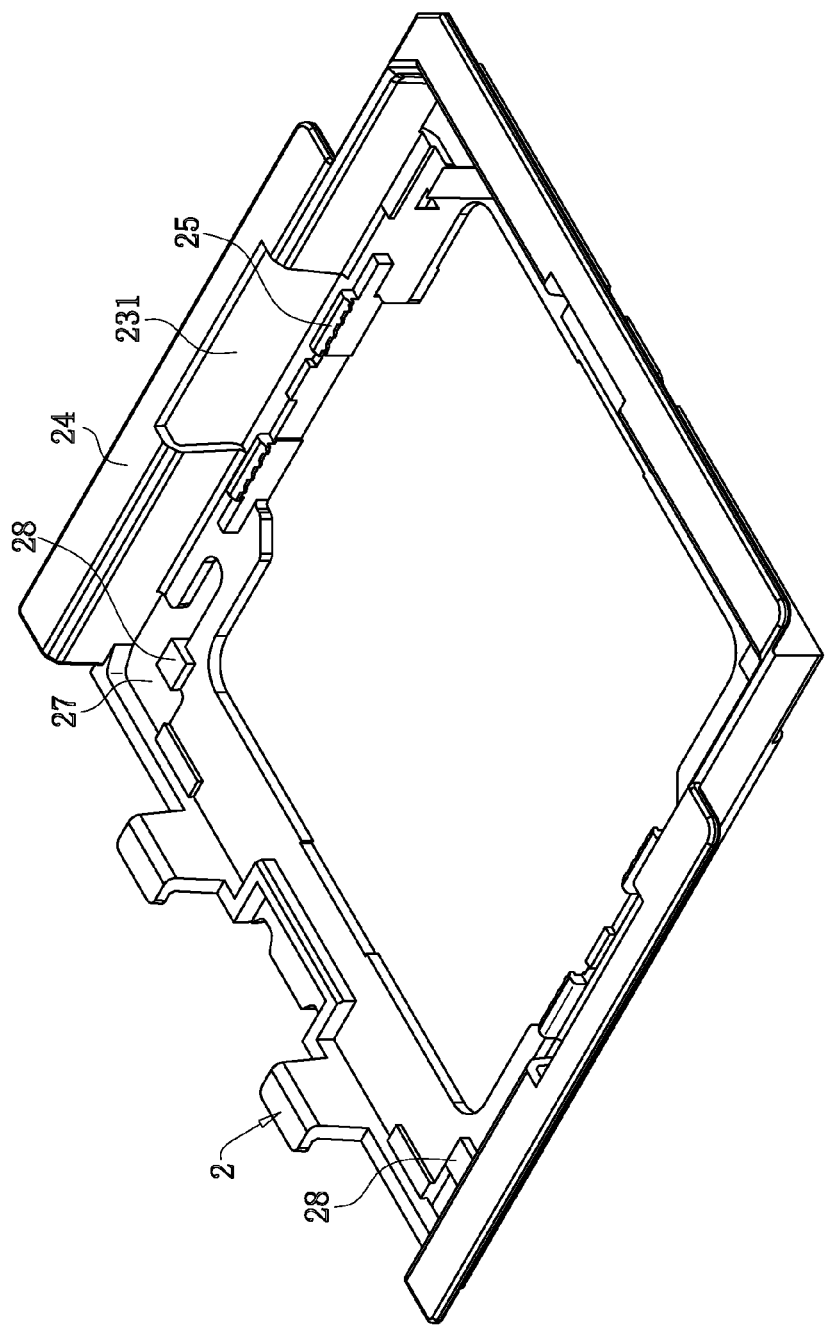
FIG. 8 is a schematic diagram of the fixing plate in another direction in the second embodiment.
Figure 9:
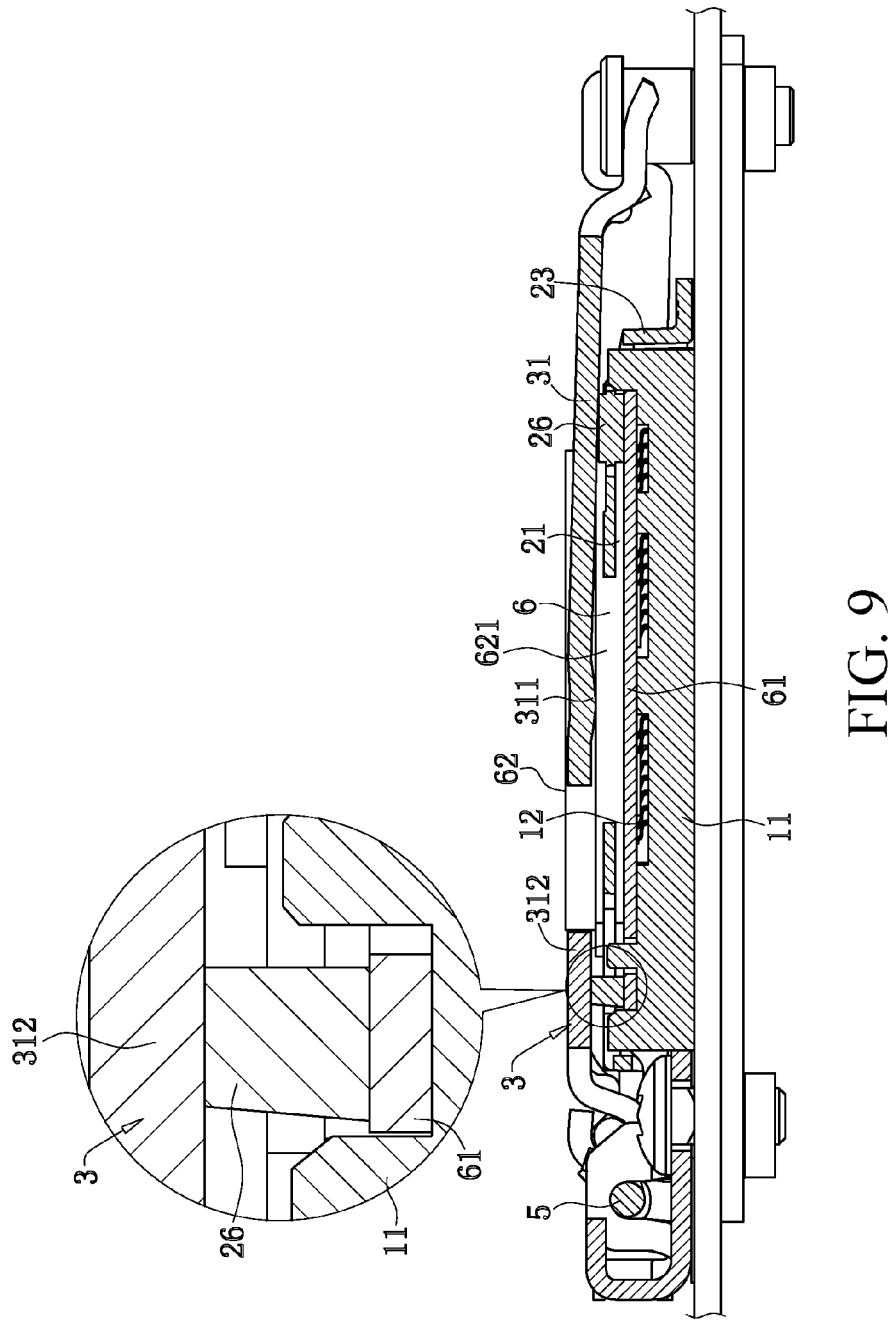
FIG. 9 is a sectional view of a load plate and a lever after being rotated and closed in the second embodiment.
Figure 10:
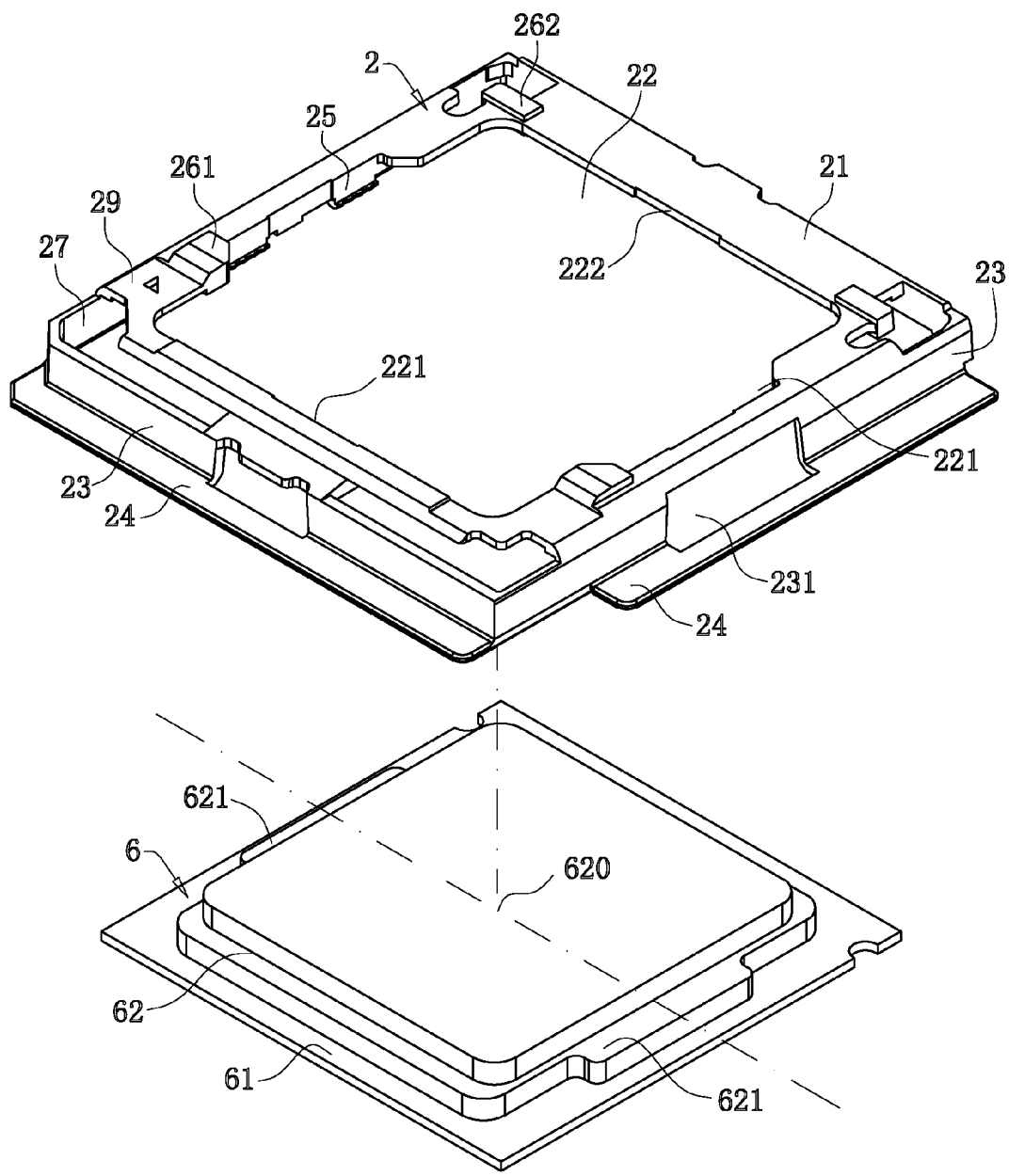
FIG. 10 is a schematic diagram of a fixing plate and a chip module before assembly in an electrical connector according to a third embodiment of the present invention.
Figure 11:
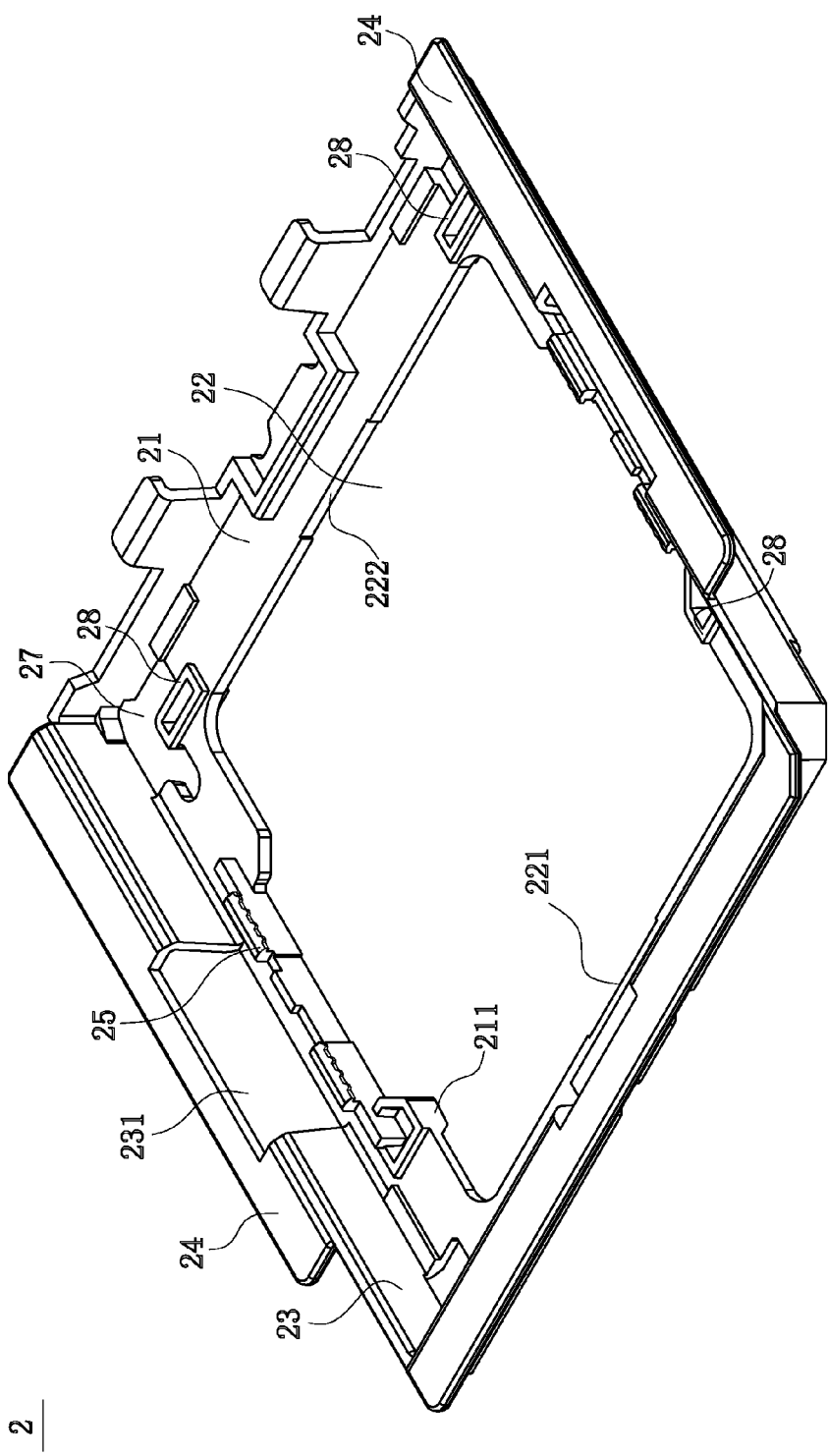
FIG. 11 is a schematic diagram of the fixing plate in another direction in the third embodiment.
Figure 12:
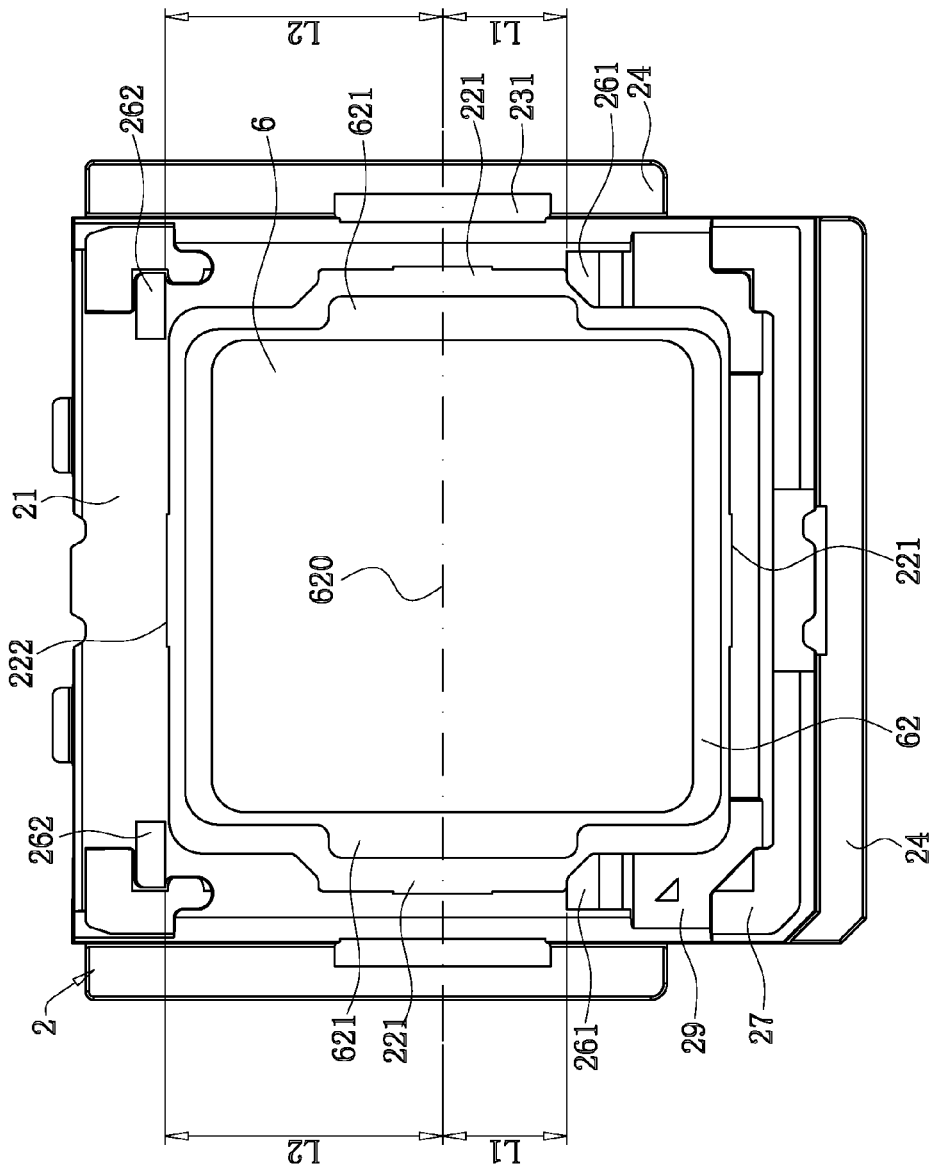
FIG. 12 is a top view of the fixing plate and the chip module after assembly in the third embodiment.
Figure 13:
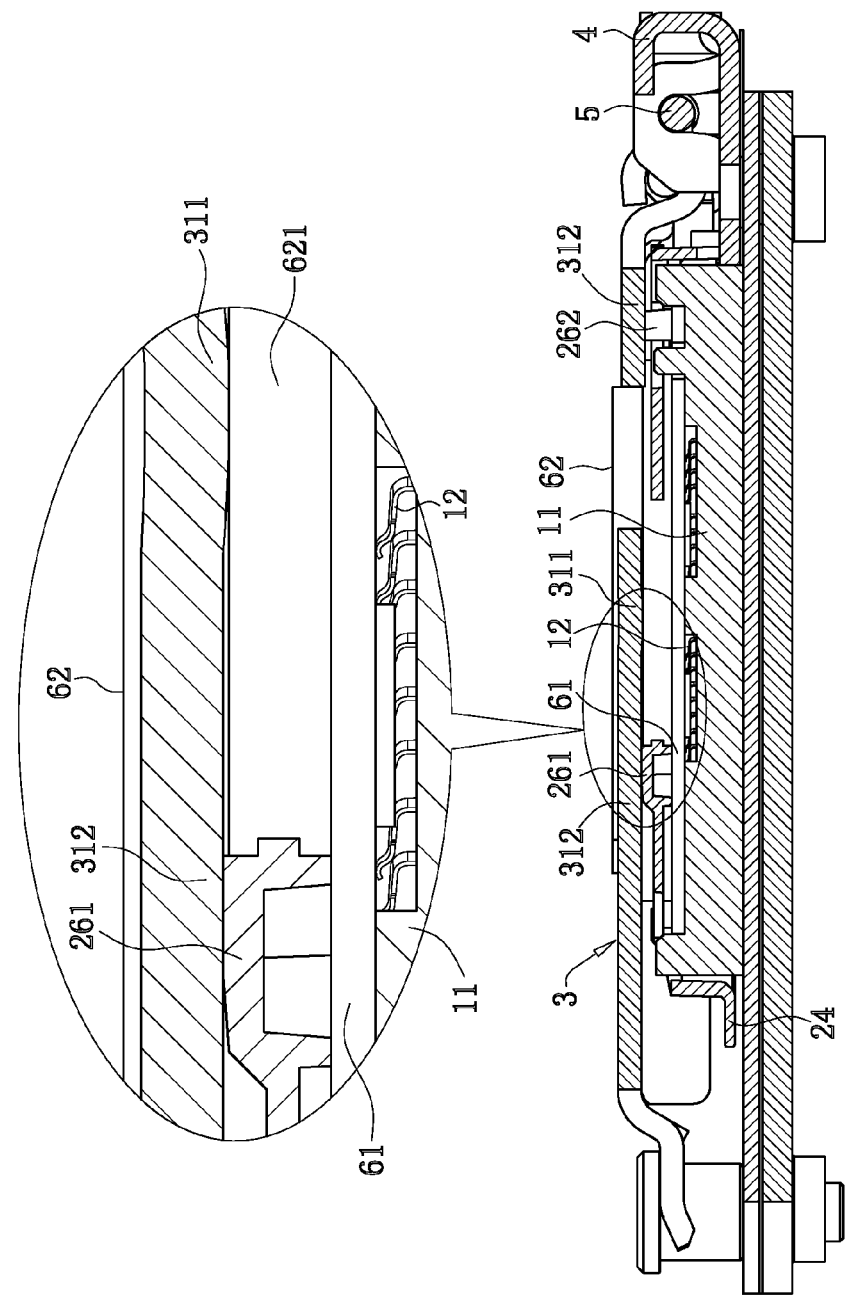
FIG. 13 is a sectional view of a load plate and a lever after being rotated and closed in the third embodiment.

As shown in FIGS. 7-9, an electrical connector according to a second embodiment of the present invention is different from that in the first embodiment in that: convex blocks 28 protrude downward from the fixing plate 2 corresponding to the four corners of the base plate 61 and press the four corners of the base plate 61 downward.

As shown in FIGS. 10-13, an electrical connector according to a third embodiment of the present invention is different from that in the first embodiment in that:

the protruding block 26 includes two first protruding blocks 261 and two second protruding blocks 262. The two first protruding blocks 261 are pentagonal. The two first protruding blocks 261 are located in front of the center 620 of the protruding portion 62, are located behind the front edge of the opening 22, each of the two first protruding blocks 261 is abut to the open slot 221 and is located behind the reserved slot 29, and a distance between the first protruding block 261 and the front edge 221 of the opening 22 in a direction from front to rear ranges from 5 mm to 8 mm, and is 6.5 mm in this embodiment. The two second protruding blocks 262 are located behind the center 620 of the protruding portion 62 and are respectively located above two corners at the back end of the base plate 61, and the two second protruding blocks 262 are rectangular and are located behind a rear edge 222 of the opening 22 (in other embodiments, the second protruding blocks 262 may be also in other shapes, and may be partially located behind the rear edge 222 of the opening 22). In the direction from front to rear, a distance L1 between the first protruding block 261 and the center 620 of the protruding portion 62 is less than a distance L2 between the second protruding block 262 and the center 620 of the protruding portion 62, and the height of the first protruding block 261 is greater than the height of the second protruding block 262. There is an interval between the first protruding block 261 and the through-hole 27. The second protruding block 212 extends from a side edge of the through-hole 27. Convex blocks 28 protrude downward from a bottom surface of the base portion 21, corresponding to the two first protruding blocks 261 and the two second protruding blocks 262 and press the base plate 61 downward.

During usage of the electrical connector of the third embodiment, the load plate 3 covers downward, the lever 5 is rotated downward, and the load plate 3 moves forward. In this process, the load plate 3 is slant and low in the front but high in the rear. The first protruding block 261 moves backward relative to the position in the first embodiment, and therefore the load plate 3 does not excessively press against the first protruding block 261, and the rear of the fixing plate 2 does not warp upward either.

The electrical connector according to certain embodiments of the present invention, among other things, has the following beneficial advantages.

1. The load plate 3 is provided with a first urging portion 311 directly pressing the protruding portion 62 downward, and the load plate 3 is provided with a second urging portion 312 pressing against the fixing plate 2 downward, so that the fixing plate 2 presses the base plate 61 downward, so as to avoid a risk that the base plate 61 is bent upward and deformed.

2. The first protruding block 261 of the fixing plate 2 is located behind the front edge of the opening 22, and when pressing downward, the load plate 3 does not excessively press against the first protruding block 261, and therefore terminals 12 located below the first protruding block 261 is not damaged after being pressed, and therefore the chip module 6 can be well electrically connected to the terminals 12.

3. Because the fixing plate 2 is made of rubber or an elastic plastic material, the fixing plate 2 can be prevented from damaging the base plate 61 during pressing.

4. The protruding block 26 protrudes from the fixing plate 2, and the second urging portion 312 presses the protruding block 26 downward, so that the load plate 3 presses more stably the fixing plate 2 downward.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments are chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector for electrically connecting a chip module, wherein the chip module comprises a base plate and a protruding portion protruding upward from the base plate, and wherein the electrical connector comprises:
   a socket for bearing the chip module:
   a fixing plate located above the base plate; and
   a load plate, covering the chip module and the fixing plate, wherein the load plate comprises a first urging portion directly pressing the protruding portion downward, and a second urging portion pressing against the fixing plate downward, so that the fixing plate presses the base plate downward, thereby pressing the chip module downward and electrically connecting the chip module to the socket;
   wherein the fixing plate comprises a base portion located above the base plate and a protruding block located above the base portion, the area of the base portion is greater than that of the protruding block, and the second urging portion presses the protruding block downward, so that the protruding block presses the base portion downward and then the base portion presses the base plate downward.

2. The electrical connector of claim 1, wherein the fixing plate corresponding to at least one corner of the base plate is provided with the protruding block.

3. The electrical connector of claim 1, wherein the socket comprises an insulting body and a plurality of terminals received in the insulting body, four corners of the insulting body are provided with stop walls projecting upward and used for stopping the chip module, the fixing plate is provided with through-holes for exposing the stop walls, a positioning portion extends downward from the base portion, the positioning portion is located at an outer side of the insulting body, and the through-hole is defined by the base portion and the positioning portion together.

4. The electrical connector of claim 3, wherein the protruding block extends from a side edge of the through-hole.

5. The electrical connector of claim 3, wherein the positioning portion is provided with a through-slot provided for an operator to grasp the fixing plate.

6. The electrical connector of claim 5, wherein a flat plate portion extends outward horizontally from the positioning portion, and the through-slot extends to the flat plate portion.

7. The electrical connector of claim 1, wherein a convex block, pressing the base plate downward and corresponding to the protruding block, protrudes downward from a bottom surface of the base portion.

8. The electrical connector of claim 1, wherein the fixing plate is provided with a clamping portion buckling a bottom surface of the chip module.

9. The electrical connector of claim 1, wherein the protruding portion comprises a sustaining portion provided for the first urging portion to press downward, the first urging portion is lower than the second urging portion, and the height of the protruding block is greater than or equal to the height of the sustaining portion.

10. The electrical connector of claim 1, wherein the base portion is provided with an opening provided for the protruding portion to pass through, and the protruding block comprises a first protruding block located in front of the center of the protruding portion and a second protruding block located behind the center of the protruding portion, wherein the first protruding block is located behind a front edge of the opening.

11. The electrical connector of claim 10, wherein in a direction from front to rear, a distance between the first protruding block and the center of the protruding portion is less than a distance between the second protruding block and the center of the protruding portion.

12. The electrical connector of claim 10, wherein the height of the first protruding block is unequal to that of the second protruding block.

13. The electrical connector of claim 12, wherein the height of the first protruding block is greater than the height of the second protruding block.

14. The electrical connector of claim 10, wherein the shape of the first protruding block is different from that of the second protruding block.

15. The electrical connector of claim 10, wherein a distance between the first protruding block and the front edge of the opening is 5 mm to 8 mm in a direction from front to rear.

16. The electrical connector of claim 10, wherein the protruding portion comprises a sustaining portion provided for the first urging portion to press downward, the opening comprises an open slot for reserving the sustaining portion, and the first protruding block is abut to the open slot.

17. The electrical connector of claim 10, wherein a top surface of the base portion is provided with a reserved slot for reserving the load plate.

18. The electrical connector of claim 17, wherein the first protruding block is located behind the reserved slot.

19. The electrical connector of claim 10, wherein the second protruding block is at least partially located behind a rear edge of the opening.

* * * * *